US012054824B2

(12) United States Patent
Takahashi et al.

(10) Patent No.: US 12,054,824 B2
(45) Date of Patent: Aug. 6, 2024

(54) SUBSTRATE PROCESSING METHOD AND SUBSTRATE PROCESSING APPARATUS

(71) Applicant: TOKYO ELECTRON LIMITED, Tokyo (JP)

(72) Inventors: Nobuhiro Takahashi, Yamanashi (JP); Junichiro Matsunaga, Yamanashi (JP); Kiyotaka Horikawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/826,880

(22) Filed: May 27, 2022

(65) Prior Publication Data

US 2022/0380892 A1   Dec. 1, 2022

(30) Foreign Application Priority Data

May 31, 2021   (JP) .................................. 2021-091646
Mar. 28, 2022  (JP) .................................. 2022-052187

(51) Int. Cl.
*C23C 16/06*   (2006.01)
*C23C 16/52*   (2006.01)
*H01L 21/02*   (2006.01)

(52) U.S. Cl.
CPC .............. *C23C 16/06* (2013.01); *C23C 16/52* (2013.01); *H01L 21/02532* (2013.01); *H01L 21/0262* (2013.01)

(58) Field of Classification Search
None
See application file for complete search history.

(56) References Cited

U.S. PATENT DOCUMENTS

| 9,607,855 B2 | 3/2017 | Takahashi et al. |
| 2008/0223825 A1 | 9/2008 | Onishi |
| 2012/0248064 A1 | 10/2012 | Onishi |
| 2013/0130499 A1* | 5/2013 | Ugajin .............. H01L 21/76224 438/689 |
| 2016/0225637 A1* | 8/2016 | Takahashi ......... H01L 21/67017 |
| 2021/0035814 A1* | 2/2021 | Omi .................. H01L 21/02087 |

FOREIGN PATENT DOCUMENTS

| JP | 6426489 B2 | 11/2018 |
| KR | 10-2008-0084742 A | 9/2008 |
| KR | 10-2016-0095617 A | 8/2016 |

* cited by examiner

*Primary Examiner* — Alexander M Weddle
(74) *Attorney, Agent, or Firm* — Fenwick & West LLP

(57) ABSTRACT

A substrate processing method is provided. The method comprises a first step of supplying a processing gas containing a halogen-containing gas and a basic gas to a substrate, which a silicon film is formed on and has a first temperature, and generating a reaction product by deforming a surface of the silicon film; and a second step of removing the reaction product by setting the substrate to a second temperature after the first step.

15 Claims, 16 Drawing Sheets

EVALUATION
TEST 3-1
(HF GAS
100sccm)

EVALUATION
TEST 3-2
(HF GAS
200sccm)

EVALUATION
TEST 3-4
(NO HF GAS
SUPPLY)

_(54)_ SUBSTRATE PROCESSING METHOD AND SUBSTRATE PROCESSING APPARATUS

CROSS-REFERENCE TO RELATED APPLICATIONS

This application claims priority to and the benefit of Japanese Patent Application Nos. 2021-091646 and 2022-052187, filed on May 31, 2021 and Mar. 28, 2022, respectively, the entire disclosures of which are incorporated herein by reference.

TECHNICAL FIELD

The present disclosure relates to a substrate processing method and a substrate processing apparatus.

BACKGROUND

In manufacturing semiconductor devices, between an Si film and an SiGe film formed on a surface of a semiconductor wafer (hereinafter referred to as "wafer") that is a substrate, the Si film may be selectively etched. For example, Japanese Patent No. 6426489 discloses that the above-described selective etching is performed using $F_2$ gas and $NH_3$ gas as an etching gas while setting a ratio of $NH_3$ gas to the etching gas to a predetermined value.

SUMMARY

The present disclosure provides a technique capable of suppressing a surface roughness of a silicon film after etching.

To this end, a substrate processing method is provided, comprising a first step of supplying a processing gas containing a halogen-containing gas and a basic gas to a substrate, which a silicon film is formed on and has a first temperature, and generating a reaction product by deforming a surface of the silicon film; and a second step of removing the reaction product by setting the substrate to a second temperature after the first step.

BRIEF DESCRIPTION OF THE DRAWINGS

The objects and features of the present disclosure will become apparent from the following description of embodiments, given in conjunction with the accompanying drawings, in which.

DETAILED DESCRIPTION

First Embodiment

Figure 1A:
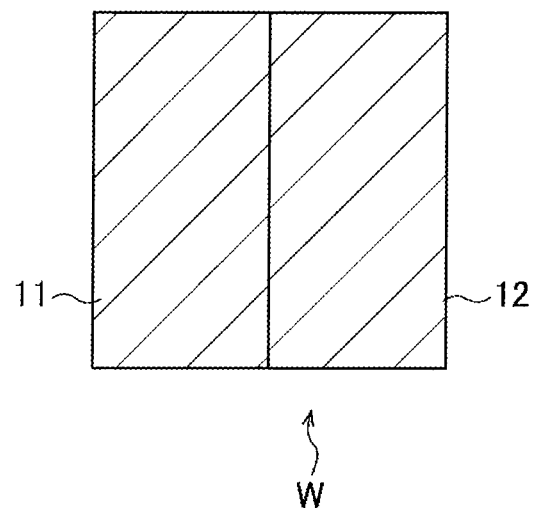
FIG. 1A is a longitudinal cross-sectional view of a wafer to be subjected to processing according to a first embodiment of the present disclosure.

The outline of processing according to a first embodiment of a substrate processing method of the present disclosure will be described. FIG. 1A is a longitudinal cross-sectional view of a surface of a wafer W that is a substrate before processing. An Si (silicon) film 11 and a silicon-containing film SiGe (silicon germanium) film 12 are exposed on the surface of the wafer W. Of the Si film 11 and the SiGe film 12, only a part of the Si film 11 is selectively etched. In other words, etching is performed such that the Si film 11 remains on the wafer W after the processing.

In order to perform such selective etching, step S1 of supplying a halogen-containing gas and a basic gas as a processing gas to the wafer W and generating a reaction product by selectively deforming the surface of the Si film 11 and the surface of the SiGe film 12 is executed. In the present embodiment, the halogen-containing gas is $F_2$ (fluorine) gas, and the basic gas is $NH_3$ (ammonia) gas. After step S1 (first step), step S2 (second step) of sublimating the reaction product by heat treatment is executed to selectively etch the surface of the Si film 11. The reaction product is ammonia fluorosilicate (AFS).

The formation of the reaction product and the sublimation are repeated. In other words, a repeating step of repeating the first step and the second step is executed to control the etching amount of the Si film 11. The Si film 11 remains on the surface of the wafer W after the repeating step (i.e., after the etching). However, as can be seen from the following evaluation tests, irregularities are formed on the surface of the Si film 11 remaining after the processing depending on processing conditions for supplying the processing gas, and the roughness of the corresponding surface (surface roughness) becomes relatively large. The processing of the present embodiment is performed such that the roughness of the surface is suppressed.

Next, the processing performed on the wafer W will be sequentially described with reference to FIGS. 1 to 3. Arrows in FIGS. 1 to 3 indicate the processing gas. The processing shown in FIGS. 1 to 3 is performed in a state where the wafer W is loaded into a processing chamber and the processing chamber is exhausted to a vacuum atmosphere of a predetermined pressure. The wafer W that is being processed is adjusted to a desired temperature. In the present embodiment, steps S1 and S2 are executed in different processing chambers.

First, the processing chamber is exhausted to, e.g., 100 mTorr (13.3 Pa) to 10 Torr (1333 Pa), and the temperature of the wafer W is adjusted to a first temperature, e.g., —20° C. to 60° C. Such temperature setting is intended to prevent the sublimation of AFS while allowing the reaction in which AFS is generated by the processing gas. The reason for preventing the sublimation of AFS will be described later. Since the processing is performed at room temperature or a temperature close to room temperature, it is advantageous in suppressing the amount of energy used for the processing.

Accordingly, it is more preferable to set the temperature of the wafer W to, e.g., 20° C. to 30° C.

Figure 1B:
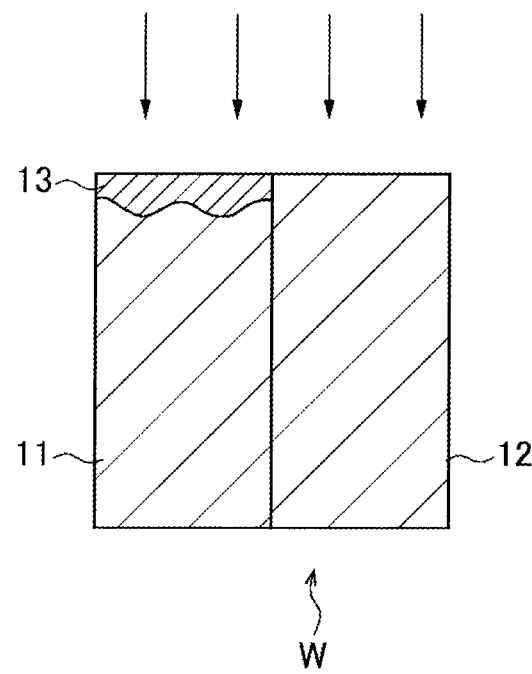
FIGS. 1B and 1C are longitudinal cross-sectional views of the wafer.

In a state where the temperature of the wafer W is adjusted, $F_2$ gas and $NH_3$ gas are supplied as the processing gas into the processing chamber, and the surface of the Si film 11 is deformed as described above, thereby forming an AFS layer 13 on the surface of the Si film 11. For example, it is assumed that the thickness of the AFS layer 13 varies due to the variation in the gas concentration distribution, the gas flow, or the like in the processing chamber (FIG. 1B). Since, however, the temperature of the wafer W is adjusted such that the AFS layer 13 remains without being sublimated, the processing gas is further supplied to the wafer W in a state where the AFS 13 covers the Si film 11.

Figure 1C:
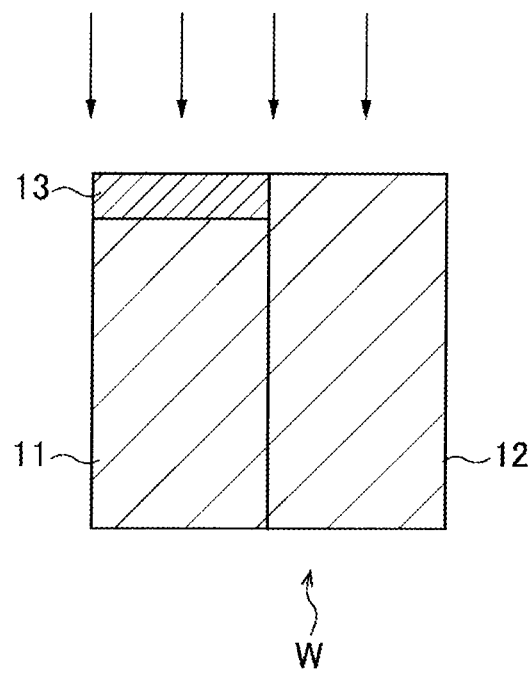

The processing gas penetrates through a portion where the AFS layer 13 is relatively thin and reaches the Si film 11 formed thereunder, thereby deforming the Si film 11. However, it is difficult for the processing gas to penetrate through a portion where the AFS layer 13 is relatively thick, so that the deformation of the Si film is unlikely to occur below the portion where the AFS layer 13 is relatively thick. Therefore, the thickness of the AFS layer 13 becomes uniform (FIG. 1C). When the thickness of the AFS layer 13 becomes uniform, the supply of the processing gas is stopped and step S1 is completed.

Figure 2A:
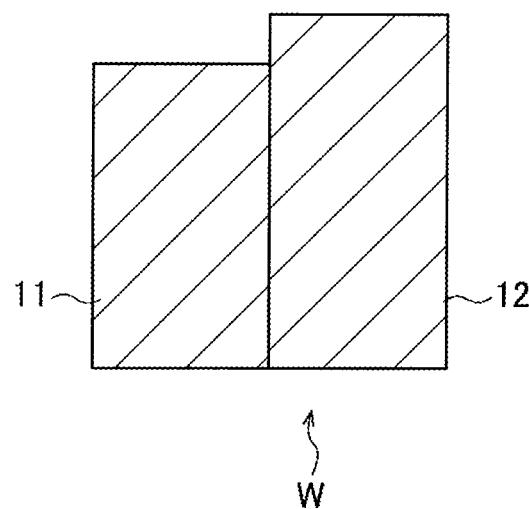
FIGS. 2A to 2C are longitudinal cross-sectional views of the wafer.

Next, step S2 (second step) is executed, and the wafer W is heated to a second temperature, e.g., 80° C. to 300° C., which is higher than the temperature in step S1 (first step). Due to the heating, the AFS layer 13 is sublimated and removed, and the Si film 11 coated on the AFS layer 13 is exposed (FIG. 2A). Although the surface of the Si film 11 is etched in steps S1 and S2, the thickness of the AFS layer 13 has been made to be uniform in step S1 as described above, so that each portion of the Si film 11 is etched uniformly. Therefore, the formation of irregularities is suppressed on the surface of the Si film 11 after the etching.

Figure 2B:
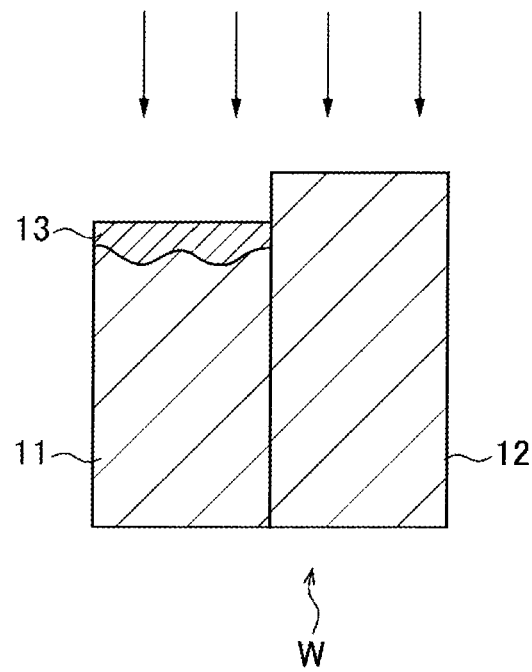
Figure 2C:
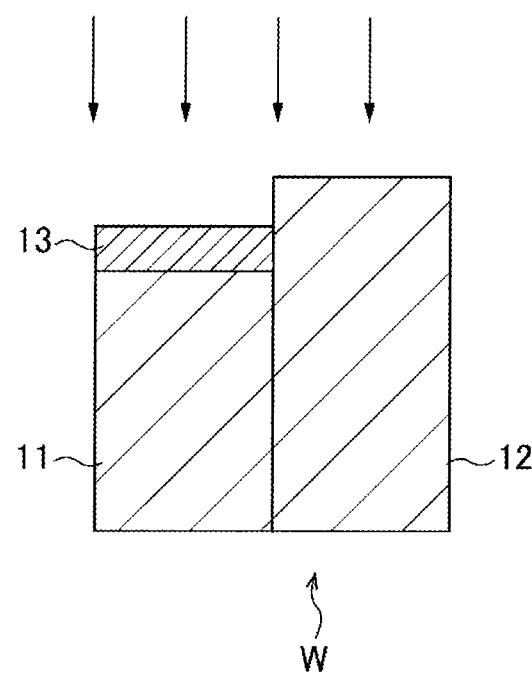
Figure 3A:
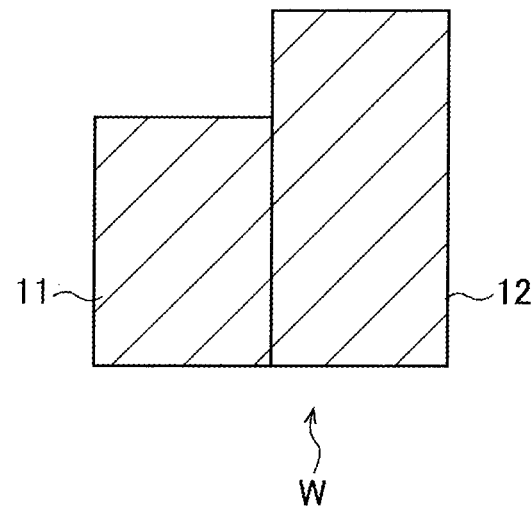
FIGS. 3A and 3B are longitudinal cross-sectional views showing a wafer surface.

Then, step S1 is executed again. Therefore, the processing gas is supplied to the wafer W that has been adjusted to the above-described temperature, so that the surface of the Si film 11 selectively becomes the AFS layer 13 (FIG. 2B). Next, the processing gas continues to be supplied in a state where the AFS layer 13 remains, so that the thickness of the AFS layer 13 becomes uniform (FIG. 2C). Next, step S2 is executed again. Hence, the AFS layer 13 formed in the second step S1 is sublimated (FIG. 3A). Accordingly, the formation of irregularities on the surface of the Si film 11 after the second etching (after the second step S1 and the second step S2) is suppressed.

Figure 3B:
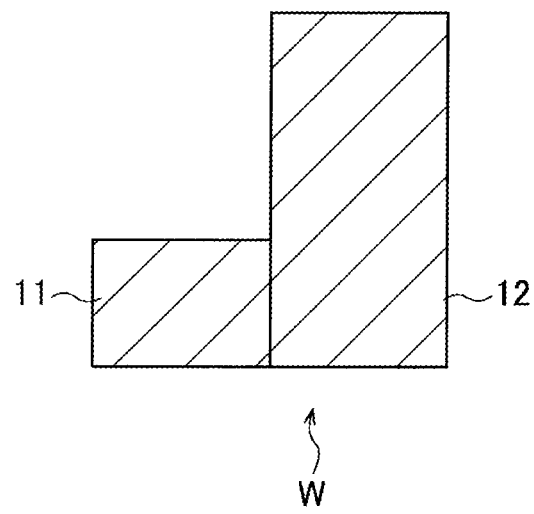

Thereafter, a cycle of steps S1 and S2 is repeated, and the selective etching of the Si film 11 proceeds. Then, when the remaining Si film 11 has a desired thickness, the repetition of steps S1 and S2 is stopped. In other words, the etching is stopped so that the Si film 11 remains on the wafer W (FIG. 3B). The formation of irregularities on the surface of the Si film 11 is suppressed in third and subsequent cycles, similarly to first and second cycles. Thus, the formation of irregularities on the surface of the Si film 11 is also suppressed after the completion of the processing. In other words, the processing is completed in a state where the roughness of the surface of the Si film 11 is suppressed.

Next, a substrate processing apparatus 2 that is an embodiment of the substrate processing apparatus for performing a series of processes described with reference to FIGS. 1 to 3 will be described with reference to the plan view of FIG. 4. The substrate processing apparatus 2 includes ae loading/unloading part 21 for loading/unloading the wafer W, two load-lock chambers 31 disposed adjacent to the loading/unloading part 21, two heat treatment modules 30 disposed adjacent to the two load-lock chambers 31, respectively, and two processing modules 4 disposed adjacent to the two heat treatment modules 30, respectively.

The loading/unloading part 21 includes a normal pressure transfer chamber 23 where a normal pressure atmosphere is maintained and a first substrate transfer mechanism 22 is disposed therein, and a carrier support 25 disposed at a side of the normal pressure transfer chamber 23 to mount carriers 24 accommodating the wafers W. In FIG. 4, a reference numeral 26 denotes an orienter chamber adjacent to the normal pressure transfer chamber 23. The orienter chamber 26 is provided to optically obtain the amount of eccentricity of the wafer W by rotating the wafer W and to align the wafer W with respect to the first substrate transfer mechanism 22. The first substrate transfer mechanism 22 transfers the wafer W between the carrier 24 on the carrier support 25, the orienter chamber 26, and the load-lock chamber 3.

A second substrate transfer mechanism 32 having an articulated arm structure, for example, is disposed in each load-lock chamber 31. The second substrate transfer mechanism 32 transfers the wafer W between the load-lock chamber 31, the heat treatment module 30, and the processing module 4. The inside of the processing chamber of the heat treatment module 30 and the inside of the processing chamber of the processing module 4 are under a vacuum atmosphere, and the inside of the load-lock chamber 31 is switched between a normal pressure atmosphere and a vacuum atmosphere to transfer the wafer W between the processing chambers under the vacuum atmosphere and the normal pressure transfer chamber.

Figure 4:
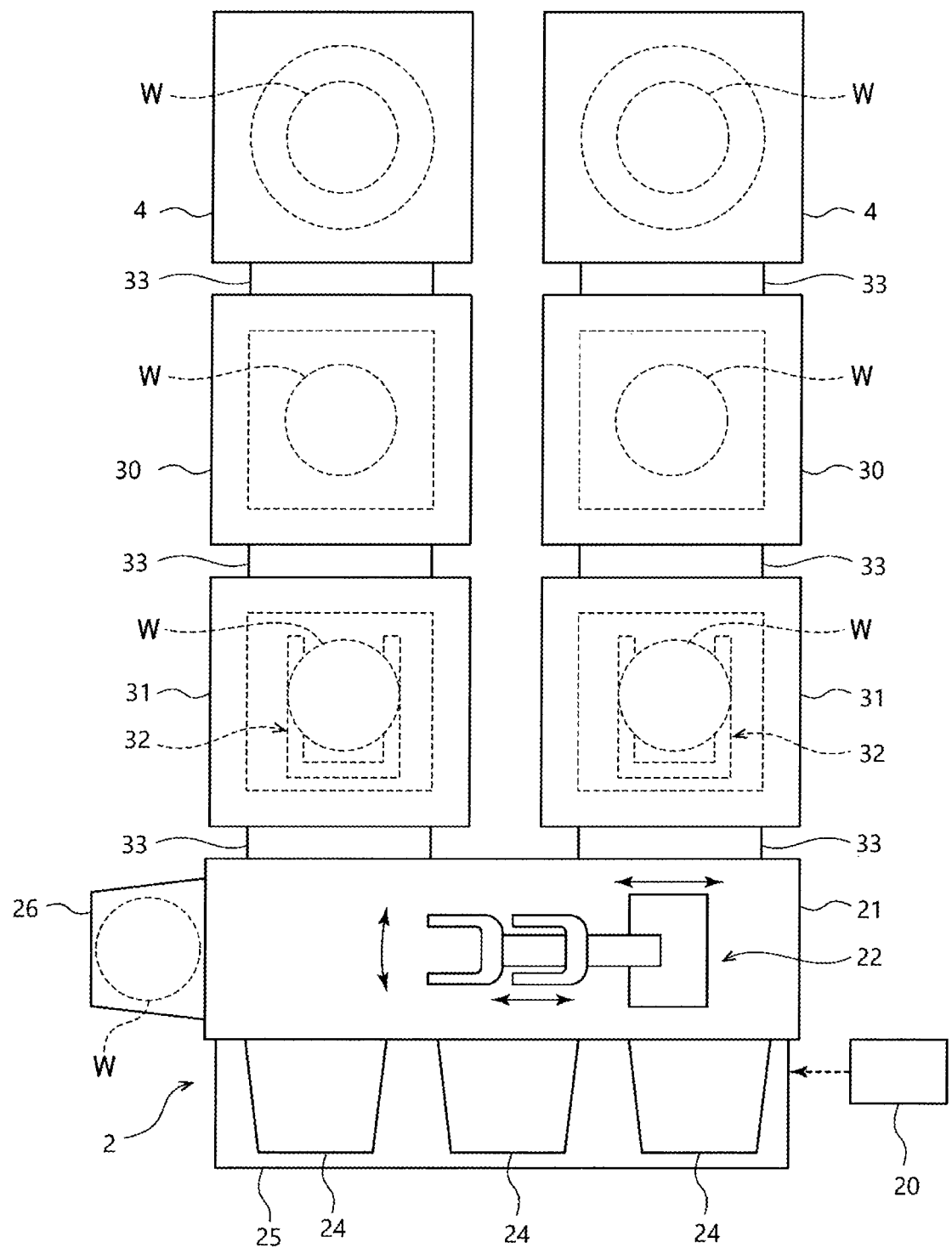
FIG. 4 is a plan view showing an embodiment of a substrate processing apparatus for performing the processing.

In FIG. 4, a reference numeral 33 denotes openable/closable gate valves, and each of the gate valves 33 is disposed between the normal pressure transfer chamber 23 and the load-lock chamber 31, between the load-lock chamber 31 and the heat treatment module 30, and between the heat treatment module 30 and the processing module 4. The heat treatment module 30 includes the above-described processing chamber, an exhaust mechanism for evacuating the processing chamber to form a vacuum atmosphere, a stage installed in the processing chamber and capable of heating the wafer W loaded thereon, and the like. The heat treatment module 30 is configured to execute step S2.

Figure 5:
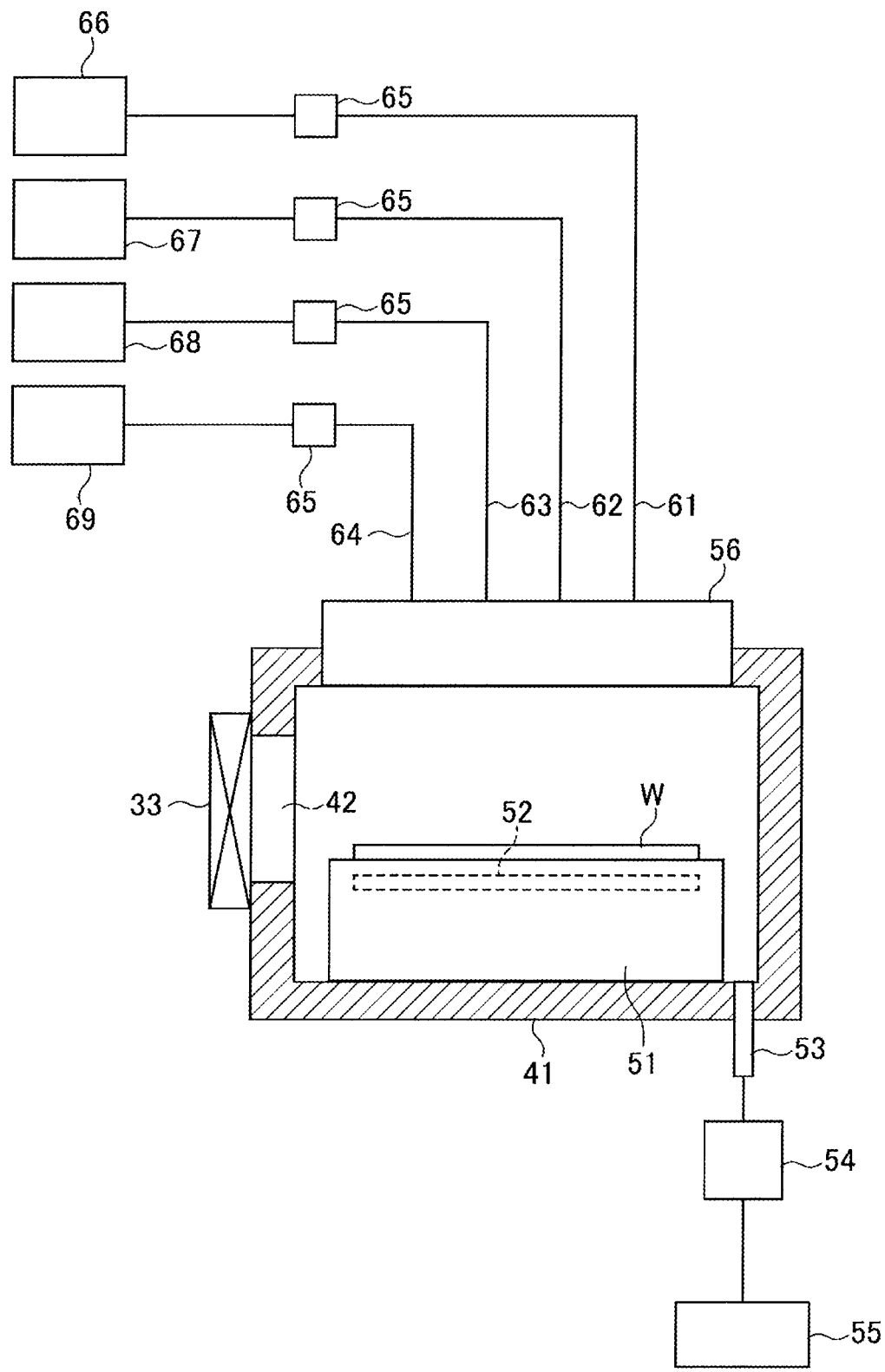
FIG. 5 is a longitudinal cross-sectional view showing an example of a processing module of the substrate processing apparatus.

The processing module 4 will be described with reference to a longitudinal cross-sectional view of FIG. 5. The processing module 4 executes the above-described step S1. In FIG. 5, a reference numeral 41 denotes a processing chamber of the processing module 4. In FIG. 5, a reference numeral 42 denotes a transfer port for the wafer W that is opened on the sidewall of the processing chamber 41. The transfer port 42 is opened and closed by the gate valve 33. A stage 51 on which the wafer W is placed is disposed in the processing chamber 41, and an elevating pin (not shown) is provided at the stage 51. The wafer W is transferred between the second substrate transfer mechanism 32 and the stage 51 by the elevating pin.

A temperature controller 52 is embedded in the stage 51 to set the temperature of the wafer W placed on the stage 51 to the above-described temperature. The temperature controller 52 is formed as a flow path forming a part of a circulation path through which a temperature control fluid such as water or the like flows, and the temperature of the wafer W is adjusted by heat exchange with the corresponding fluid. However, the temperature controller 52 is not limited to the flow path for a fluid, and may include a heater for performing resistance heating, for example.

One end of an exhaust line 53 is opened in the processing chamber 41, and the other end of the exhaust line 53 is connected to an exhaust mechanism 55 including, e.g., a vacuum pump, through a valve 54 that is a pressure changing mechanism. By adjusting an opening degree of the valve 54, a pressure in the processing chamber 41 is set to be within the above-described range, and the processing is performed.

A gas shower head 56 that is a processing gas supply mechanism is disposed at an inner upper portion of the processing chamber 41 to face the stage 51. The downstream sides of gas supply paths 61 to 64 are connected to the gas shower head 56, and the upstream sides thereof are connected to gas supply sources 66 to 69 through flow rate controllers 65, respectively. Each flow rate controller 65 includes a valve and a mass flow controller. The supply of gases from the gas supply sources 66 to 69 to the downstream sides is started and stopped by opening and closing the valves included in the flow rate controllers 65.

$F_2$ gas, $NH_3$ gas, Ar (argon) gas, and $N_2$ (nitrogen) gas are supplied from the gas supply sources 66, 67, 68, and 69, respectively. Therefore, $F_2$ gas, $NH_3$ gas, Ar gas, and $N_2$ gas can be supplied from the gas shower head 56 into the processing chamber 41. Ar gas and $N_2$ gas are supplied as a carrier gas into the processing chamber 41 together with $F_2$ gas and $NH_3$ gas. $F_2$ gas is supplied into the processing chamber 41 at a flow rate of 100 sccm to 1000 sccm, and $NH_3$ gas is supplied into the processing chamber 41 at a flow rate of 4 sccm to 80 sccm.

As shown in FIG. 4, the substrate processing apparatus 2 includes a controller 20 that is a computer. The controller 20 includes a program, a memory, and a CPU. The program includes instructions (each step) so as to process the wafer W and transfer the wafer W, and the program is stored in a storage medium such as a compact disc, a hard disk, or a magneto-optical disk, or a digital versatile disc (DVD) and installed in the controller 30. The controller 30 outputs a control signal to respective components of the substrate processing apparatus 2 and controls the operation of each component through the program. Specifically, the operation of the etching module 4, the operation of the heat treatment module 30, the operation of the first substrate transfer mechanism 22, the operation of the second substrate transfer mechanism 32, and the operation of the orienter chamber 26 are controlled through control signals. The operation of the etching module 4 includes operations of adjusting the temperature of the fluid supplied to the stage 51, starting and stopping the supply of each gas from the gas shower head 56, adjusting the exhausted flow rate using the valve 54, and the like.

A transfer path of the wafer W in the substrate processing apparatus 2 will be described. As described with reference to FIG. 1A, the carrier 24, which loads the wafer W having each film formed thereon, is placed on the carrier support 25. The wafer W is transferred in the order of the normal pressure transfer chamber 23→the orienter chamber 26→the normal pressure transfer chamber 23→the load-lock chamber 31 and is transferred to the processing module 4 through the heat treatment module 30. Then, as described above, the processing in step S1 is performed to form the AFS layer 13. Then, the wafer W is transferred to the heat treatment module 30, and the sublimation of the AFS layer 13 in step S2 is performed.

Then, the wafer W is transferred between the processing module 4 and the heat treatment module 30, so that steps S1 and S2 are repeated a predetermined number of times. Next, the wafer W is transferred from the heat treatment module 30 in the order of the load-lock chamber 31→the normal pressure transfer chamber 23 and is returned to the carrier 24.

In accordance with the processing method of the present embodiment, of the Si film 11 and the SiGe film 12, the Si film 11 can be selectively etched as described above, and the roughness on the surface of the Si film 11 after the etching can be suppressed. Therefore, the yield of the semiconductor product manufactured from the etched wafer W can be increased.

In the above processing example, steps S1 and S2 are repeated three or more times in the case of etching the Si film 11. However, the number of repetitions is not limited thereto, and may be twice, for example. Alternatively, steps S1 to S2 may be executed only once without repetition. In the above-described substrate processing apparatus 2, the wafer W is transferred between the processing module 4 and the heat treatment module 30, and steps S1 and S2 are executed in different processing chambers. However, the present disclosure is not limited thereto, and steps S1 and S2 may be executed while changing the temperature of the stage 51 of the processing module 4, for example. In other words, steps S1 and S2 may be executed in the same processing chamber. However, in the case of repeating steps S1 and S2, a period of time for lowering the temperature of the stage 51 is required to execute step S1 again after step S2. Therefore, in order to obtain a high throughput in the case of repeating steps S1 and S2, it is preferable to place and process the wafer W on the stages of different processing chambers in steps S1 and S2, as described above.

In the above-described example, the SiGe film 12 that is a silicon-containing film is exposed on the surface of the wafer W. However, a SiN film or an $SiO_2$ film, for example, may be exposed on the surface of the wafer W, instead of the SiGe film 12. The Si content in the SiN film and the $SiO_2$ film is lower than that in the Si film. Therefore, the generation of AFS by the reaction of $NH_3$ gas and $F_2$ gas is less likely to occur, compared to the Si film 11. Accordingly, even if the SiN film and the $SiO_2$ film are exposed, instead of the SiGe film 12, on the surface of the wafer W, the Si film 11 can be selectively etched. The halogen gas is not limited to $F_2$ gas, and may be, e.g., $IF_7$ gas, $IF_5$ gas, $ClF_3$ gas, and $SF_6$ gas. In that case as well, it is possible to form the AFS layer 13 and perform the same processing.

In the above example, the processing is performed by simultaneously supplying $F_2$ gas and $NH_3$ gas to the wafer W. In other words, a period of supplying $F_2$ gas and a period of supplying $NH_3$ gas are the same. However, the present disclosure is not limited thereto, and $F_2$ gas and $NH_3$ may be supplied alternately and repeatedly so that AFS can be generated by the reaction between one of $F_2$ gas and $NH_3$ gas adsorbed on the Si film 11 and the other gas. In other words, $F_2$ gas and $NH_3$ gas may be supplied such that the period of supplying $F_2$ gas and the period of supplying $NH_3$ gas do not overlap. Alternatively, $F_2$ gas and $NH_3$ gas may be supplied such that the period of supplying $F_2$ gas and the period of supplying $NH_3$ gas partially overlap. However, it is preferable to supply $F_2$ gas and $NH_3$ gas simultaneously as in the case of FIGS. 1 to 3, because the formation of the AFS layer 13 and the uniform thickness of the AFS layer 13 can be quickly realized, and the throughput can be increased.

In the case of sublimating the AFS layer 13, in the above example, the temperature of the wafer W is set to be higher in step S2 than in step S1. However, it is not necessary to change the temperature of the wafer W. For example, steps S1 and S2 may be executed in the same processing module 4. Further, when step S2 is executed, the opening degree of the valve 54 of the exhaust line 53 is set to be greater than that in the execution of step S1. Accordingly, the pressure in the processing chamber 41 is decreased during the execution of step S2 than during the execution of step S1. The AFS layer 13 may be sublimated by such a pressure change.

Second Embodiment

Figure 6:
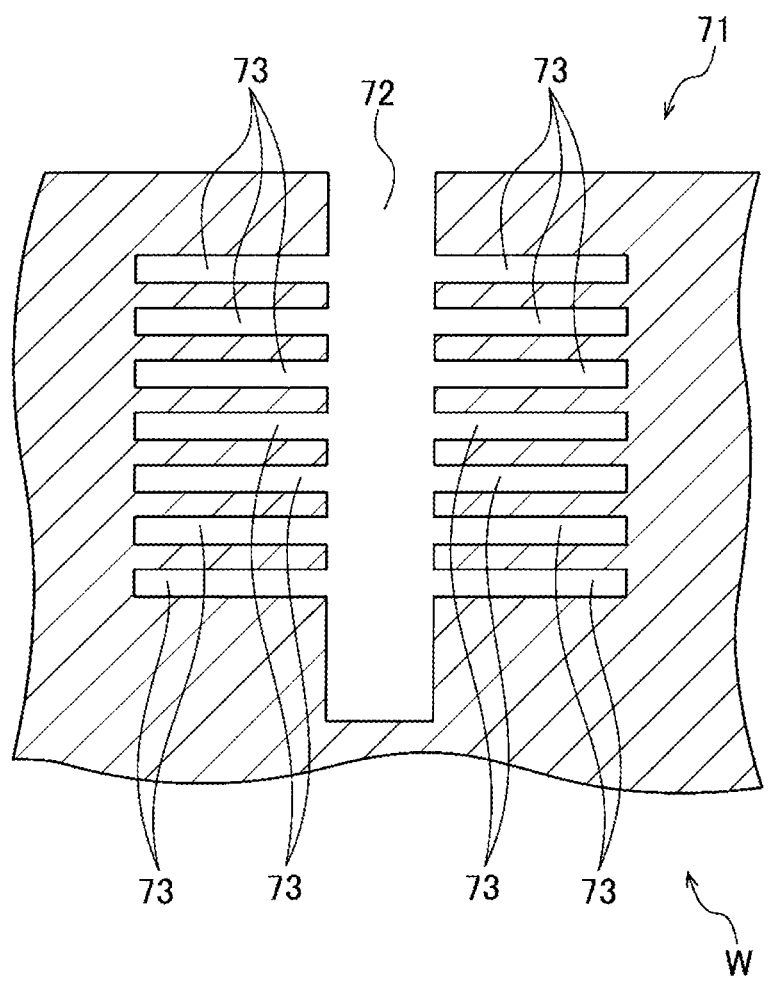
FIG. 6 is a longitudinal cross-sectional view of a wafer to be subjected to processing according to a second embodiment of the present disclosure.

In a second embodiment, the wafer W having the structure 71 shown in FIG. 6 formed on the surface thereof is processed. FIG. 6 is a longitudinal cross-sectional view of the structure 71. The structure 71 has an Si film, and includes a recess 72 formed through the Si film in a vertical direction (thickness direction of the wafer W), and recesses 73 formed through the Si film to face the left side and the right side from the left sidewall and the right sidewall of the recess 72. The recess 72 is opened on the surface of the wafer W, and each gas supplied to the wafer W is introduced into the recesses 73 through the recess 72. Since the recesses 73 are formed at different heights in the vertical direction on the left side and the right side of the recess 72, the recesses 73 and the Si film are alternately arranged in the vertical direction on the left side and the right side of the recess 72.

Figure 7:
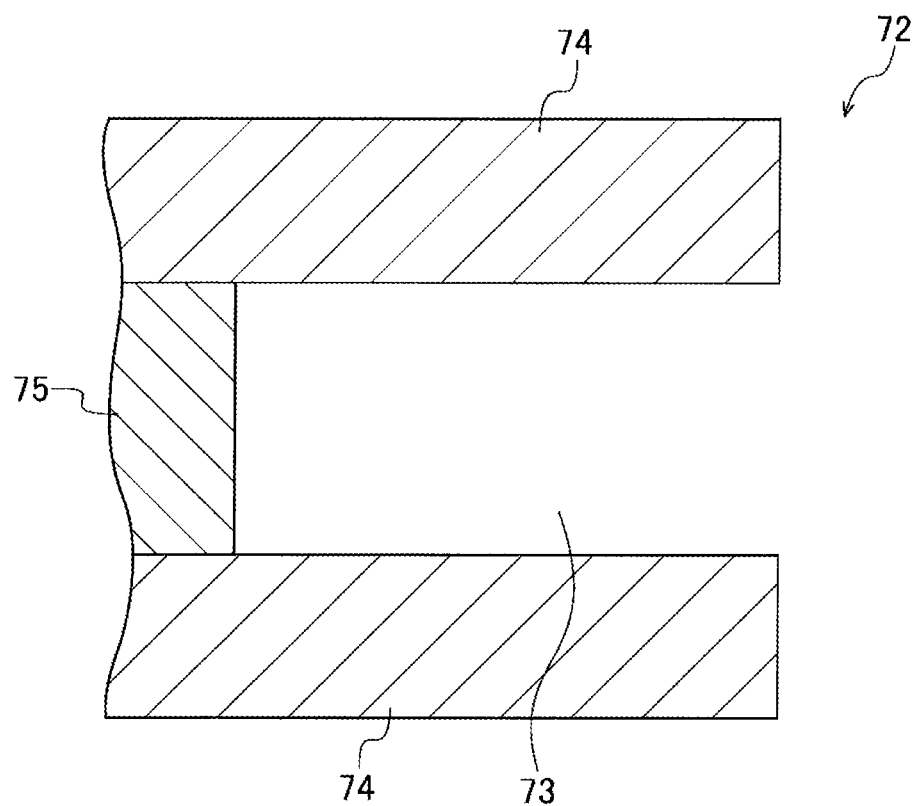
FIG. 7 is a longitudinal cross-sectional view of a recess formed in the wafer.

The structure 71 will be further described with reference to the longitudinal cross-sectional view of FIG. 7 in which one of the recesses 73 is enlarged and schematically illustrated. Since the structure 71 has been described, the upper wall and the lower wall of the recess 73 are formed as an Si film 74 in FIG. 7. The sidewall of the recess 73 is formed as an SiGe film 75. In the second embodiment, the Si film 74 forming the upper wall and the lower wall of the recess 73 is selectively etched with respect to the SiGe film 75 to reduce the vertical thickness of the Si film 74. In other words, the opening width of the recess 73 is widened. This etching is performed such that the roughness of the surface of the Si film 74 after etching is suppressed.

Hereinafter, the differences between the etching in the second embodiment and the etching in the first embodiment will be described with reference to FIGS. 8 to 11. FIGS. 8 to 11 schematically show changes in the Si film 74 that are expected during the processing. In this processing, $F_2$ gas and HF (hydrogen fluoride) gas are used, in addition to $NH_3$ gas, as the fluorine-containing gas. In FIGS. 8 to 11, reference numerals 81, 82, 83 denote $F_2$ gas, $NH_3$ gas, and HF gas, respectively.

Figure 8:
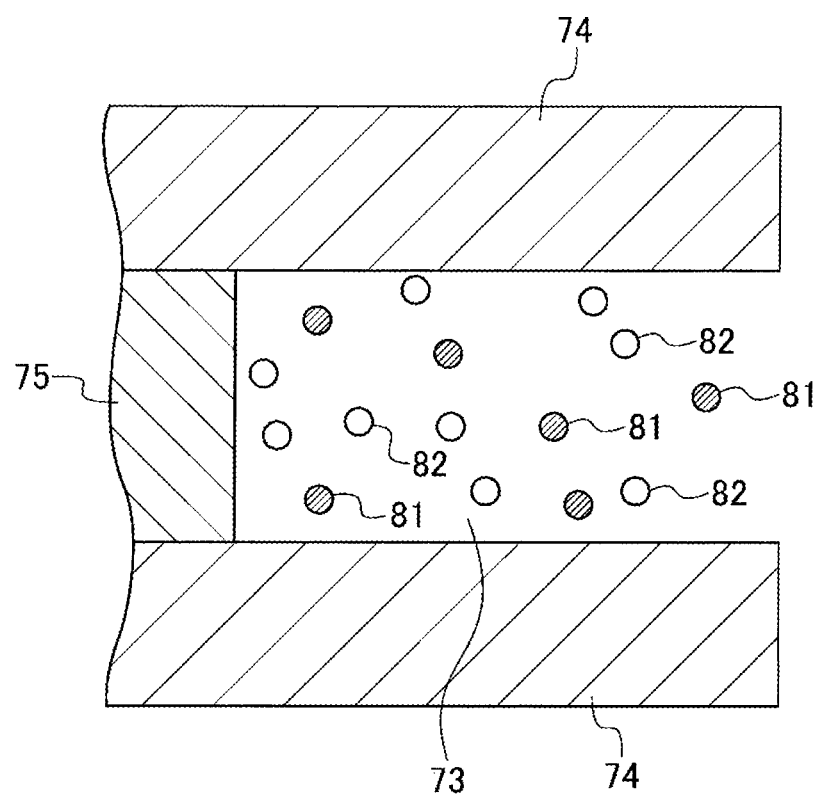
FIGS. 8 to 11 explain changes in the recess.
Figure 9:
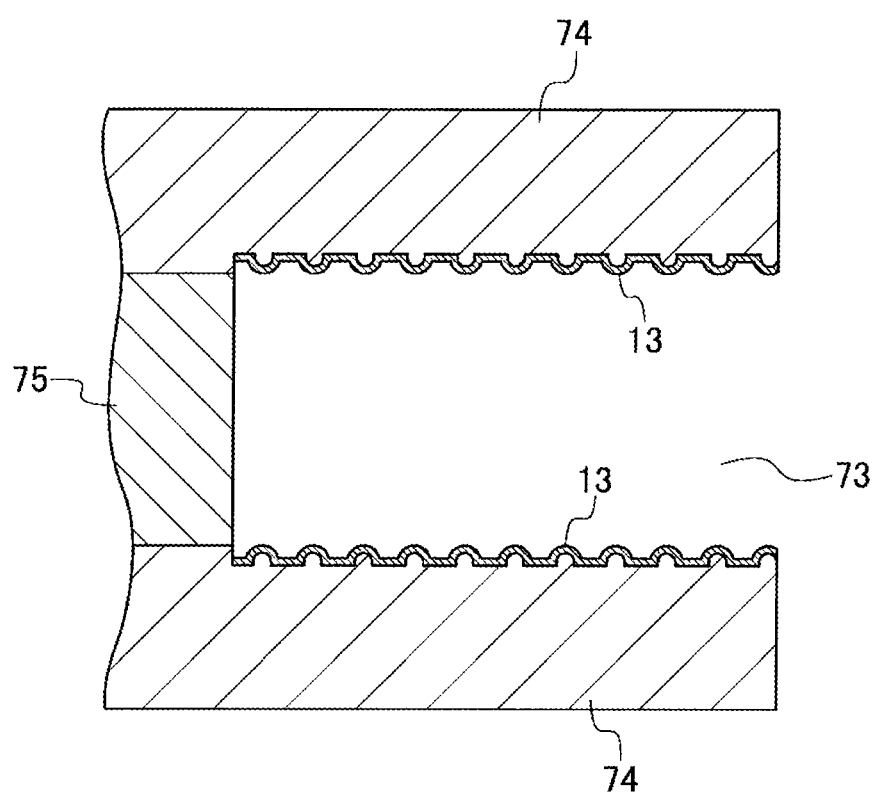
Figure 10:
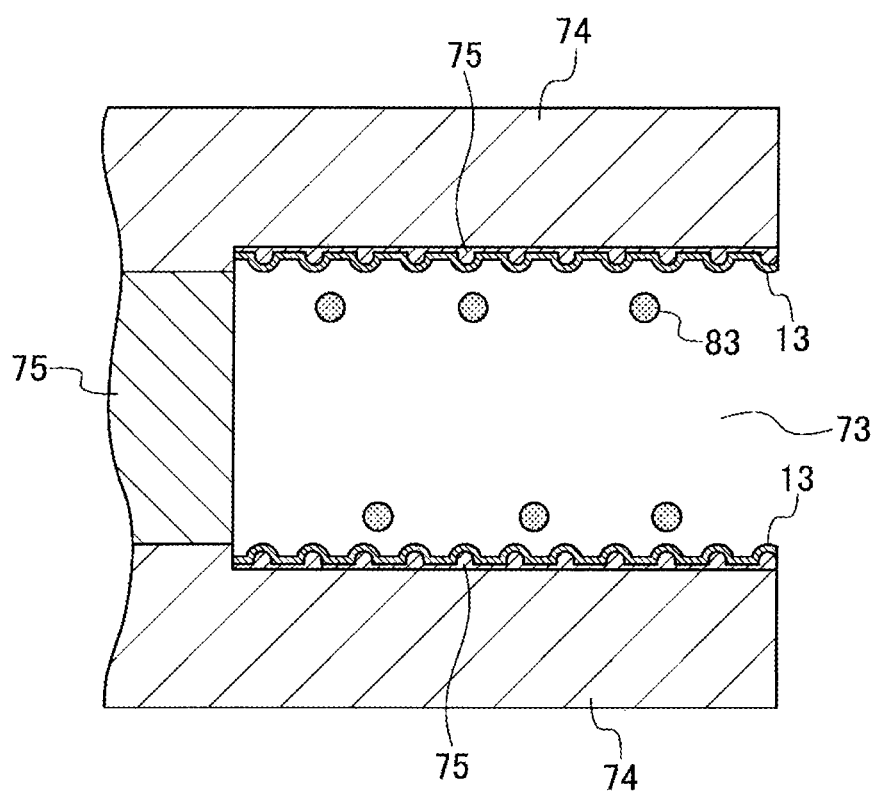

First, in a state where a pressure in the processing chamber 41 where the wafer W is stored and a temperature of the wafer W in the processing chamber 41 are adjusted to the pressure and the temperature in step S1 of the first embodiment, $F_2$ gas 81 and $NH_3$ gas 82 are simultaneously supplied as in step S1 (FIG. 8, step T1). Accordingly, the surface layer of the Si film 74 forming the recess 73 is deformed, thereby forming the AFS layer 13. When the AFS layer 13 is formed, fine irregularities are formed on the surface layer of the Si film 74 by the action of each gas, and the AFS layer 13 is formed to cover the Si film 74 on which the irregularities are formed. (FIG. 9).

After the supply of the $F_2$ gas 81 and $NH_3$ gas 82 into the processing chamber 41 is stopped, $N_2$ gas is supplied into the processing chamber 41 to purge and remove the remaining $F_2$ gas 81 and $NH_3$ gas 82 from the processing chamber 41 (step T2). Then, the HF gas 83 is supplied into the processing chamber 41 (FIG. 10: step T3), and it is considered that the reaction expressed by the following Eq. (1) occurs between the HF gas 83, the AFS layer 13, and the Si film 74 in contact with the AFS $((NH_4)_2SiF_6)$ layer 13.

$$2Si + ((NH_4)_2SiF_6) + 4HF \rightarrow SiF_6 + SiH_4 + (NH_4)_2SiF_6 \quad \text{Eq. (1)}$$

The above rection will be described in detail. The AFS layer 13 formed in step T1 contains a relatively large amount of fluorine. Since the HF gas 83 containing fluorine is supplied in step T3, the amount of fluorine in the AFS layer 13 becomes excessive, and the outermost surface of the Si film 74 in contact with the AFS layer 13 is fluorinated to make the deformed layer 75. It is considered that the outermost layer of the Si film 74 is changed to the deformed layer 75 because fluorine contained in the AFS layer 13 is used while using the supply of the fluorine-containing gas as a trigger.

Figure 11:
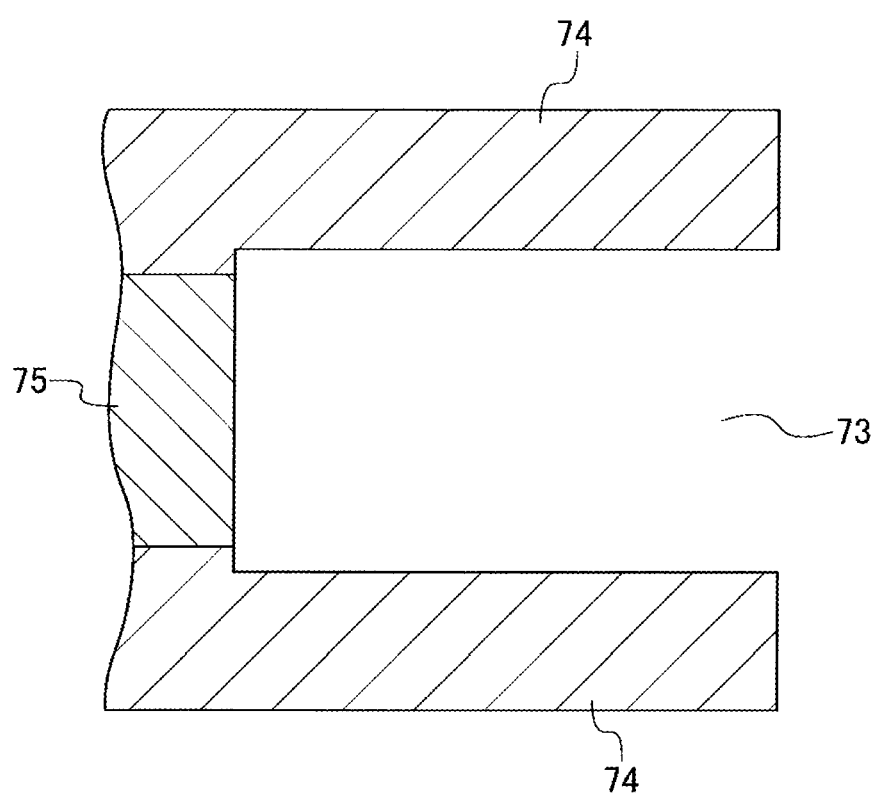

Then, the supply of the HF gas 83 into the processing chamber 41 is stopped, the $N_2$ gas is supplied into the processing chamber 41 to purge and remove the remaining HF from the processing chamber 41 (step T4). Next, the wafer W is heated to, e.g., 80° C. to 300° C., higher than the temperature in steps T1 to T4, as in step S2 of the first embodiment. Due to the heating, the AFS layer 13 and the deformed layer 75 are sublimated and removed, and the Si film 74 coated thereon is exposed (FIG. 11: step T5).

Since the outermost surface of the Si film 74 on which the irregularities are formed after the completion of step T1 is removed, the roughness of the surface of the Si film 74 exposed in step T5 is suppressed. Similarly to the first embodiment, of the Si film 74 and the SiGe film 75, the Si film 74 is selectively etched by the above-described processing. Then, the cycle of steps T1 to T5 is repeated, so that the selective etching of the Si film 11 proceeds and the Si film 74 becomes thinner. When the Si film 74 has a desired thickness, the repetition of the cycle of steps T1 to T5 is stopped.

In the etching of the second embodiment, the roughness of the Si film after the etching can be more reliably suppressed as can be seen from the following evaluation tests. In the etching of the second embodiment, the substrate processing apparatus 2 described with reference to FIG. 4 can be used, for example, and it is possible to execute steps T1 to T4 in the processing module 4 and execute step T5 in the heat treatment module 30. Steps T1 to T4 executed in the processing module 4 correspond to the first process of generating a reaction product by deforming the Si film 74. Step T1 corresponds to a first supply step in the $F_2$ gas that is a first fluorine-containing gas and the $NH_3$ gas that is a basic gas are simultaneously supplied to the wafer W. Step T3 corresponds to a second supply step. In this example, the HF gas that is a second fluorine-containing gas different from the first fluorine-containing gas is supplied to the wafer W.

The processing module 4 for performing steps T1 to T4 has a configuration in which an HF gas supply source is provided in addition to the above-described gas supply sources 66 to 69 and the HF gas supply source and the gas shear head 56 are connected through a flow path. The flow rate controller 65 is disposed in the flow path of the HF gas, similarly to the flow path of another gas, and the HF gas is supplied into the processing chamber 41 at a desired flow rate through the gas shower head 56. In the case of supplying the HF gas into the processing chamber 41 as well, Ar gas and $N_2$ gas are supplied as the carrier gas into the processing chamber 41.

In step T3, a gas that can cause a reaction between fluorine contained in the AFS layer 13 and the Si film 74 while acting on the AFS layer 13 may be used, and another fluorine-containing gas, e.g., $F_2$ gas, $NF_3$ (nitrogen trifluoride) gas, or the like, may be used instead of HF gas. In the case of using $F_2$ gas, the same type of fluorine-containing gas is used in steps T1 and T3. In the above processing example, purging using $N_2$ gas that is an inert gas is performed in step T2 to suppress the influence of the gas used in step T1 on the processing of step T3. However, step T2 may be omitted when $F_2$ gas is used in both step T1 and step T3. Specifically, first, in step T1, both $F_2$ gas and $NH_3$ gas are simultaneously supplied into the processing chamber 41. Then, the supply of $NH_3$ gas is stopped, and only $F_2$ gas is supplied into the processing chamber 41. Accordingly, it is possible to omit step T2 and perform the processing of step T3.

In step T3, $NH_3$ gas may be supplied instead of the fluorine-containing gas. As described above, the AFS layer 13 contains a large amount of fluorine. Since, however, $NH_3$ gas is supplied, the fluorine of the AFS layer 13 reacts with $NH_3$ gas and the outermost surface of the Si film 74. Accordingly, the outermost surface of the Si film 74 is deformed to generate a reaction product. The reaction product is sublimated and removed together with the AFS layer 13 in step T5. Hence, the roughness on the surface of the Si film 74 after the execution of step T5 is suppressed. In the case of supplying $NH_3$ gas in step T3, step T2 may be omitted as in the case of using $F_2$ gas in step T3.

As described above, the gas supplied to the wafer W in the second supply step executed after the first supply step in which $F_2$ gas (first fluorine-containing gas) and $NH_3$ gas are simultaneously supplied to the wafer W is not limited to the second fluorine-containing gas different from the first fluorine-containing gas. In the first embodiment, the same supply period of $F_2$ gas and $NH_3$ gas (the same supply start timings and the same supply stop timings of the gases) indicates the simultaneous supply thereof in the present specification. In the second embodiment, when $F_2$ gas and $NH_3$ gas are supplied simultaneously, it is unnecessary to set the supply start timings of these gases to be the same. In other words, it is unnecessary to simultaneously supply $F_2$ gas and $NH_3$ gas in the present specification.

Steps T1 to T5 are not necessarily repeated multiple times, and may be executed only once. Although an example in which the horizontal wall surfaces of the recess 73 of the structure 71 are etched has been described, the etching location may vary without being limited to the corresponding wall surfaces.

The embodiments of the present disclosure are considered to be illustrative in all respects and not restrictive. The above-described embodiments can be changed and modified in various forms without departing from the scope of the appended claims and the gist thereof.

(Evaluation Tests)
Evaluation Test 1

The evaluation tests related to the present disclosure will be described. In an evaluation test 1, the wafer W was subjected to etching in which steps S1 and S2 are repeated multiple times as described in the above embodiment. The Si film 11 and the SiGe film 12 are exposed on the surface of the wafer W used in this processing, as described in the above embodiment. In step S1 of the evaluation test 1, the flow rate of $F_2$ gas and the flow rate of $NH_3$ gas supplied into the processing chamber storing the wafer W were set to be within the above-described ranges. Further, as described in the above embodiment, Ar gas and $N_2$ gas were supplied into the processing chamber together with the $F_2$ gas and the $NH_3$ gas. The pressure in the processing chamber and the temperature of the wafer W in step S1 were set to be within the ranges described in the above embodiment.

In the evaluation test 1, the wafers were processed under different conditions of the supply time of the processing gas ($F_2$ gas and $NH_3$ gas) in single step S1 and the number of repetitions of steps S1 and S2. Then, in each processed wafers W, the image of the surface of the Si film 11 was obtained, and the etching selectivity (=etching amount of the Si film 11/etching amount of the SiGe film 12) was calculated. In an evaluation test 1-1, the processing gas supply time was set to 30 seconds, and the number of repetitions was set to six. In an evaluation test 1-2, the processing gas supply time was set to 45 seconds, and the number of repetitions was set to four. In an evaluation test 1-3, the processing gas supply time was set to 60 seconds, and the number of repetitions was set to three. Therefore, in the evaluation tests 1-1 to 1-3, the total period of time in which the processing gas is supplied to the wafer W is 180 seconds.

Figure 12:
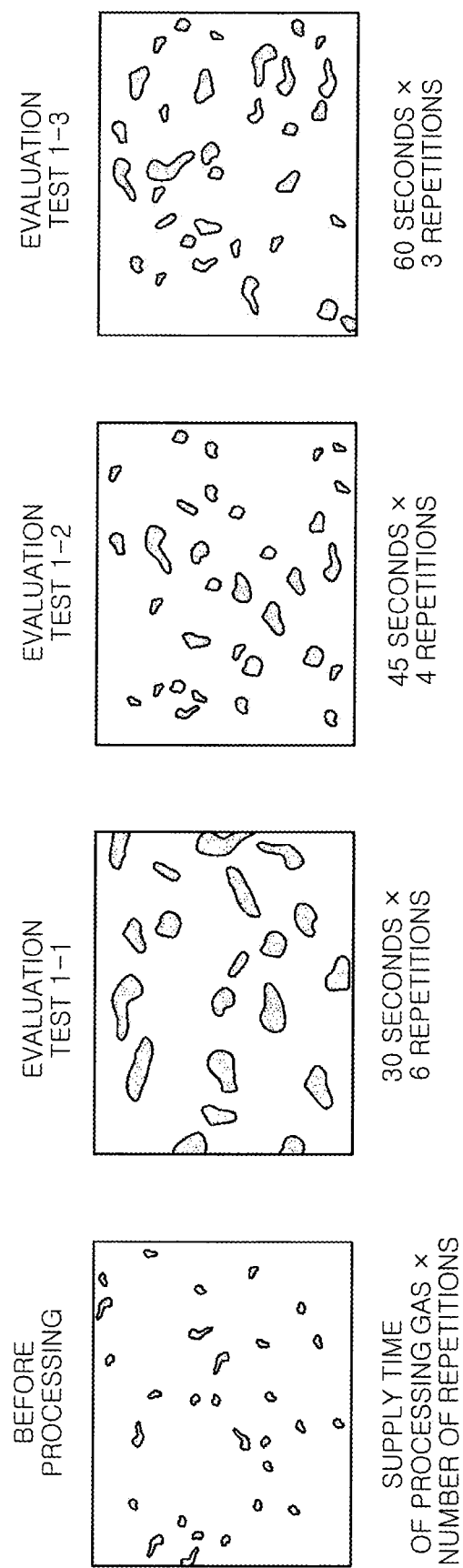
FIGS. 12 and 13 are plan views showing evaluation test results.

In the evaluation tests 1-1 to 1-3, the etching selectivity was 30 or more, so that the Si film 11 was selectively etched with respect to the SiGe film 12. FIG. 12 schematically shows the images obtained in the evaluation tests 1-1 to 1-3 and the image of the Si film 11 before the processing. In the obtained images, the irregularities on the surface of the Si film 11 are expressed as black and white contrast. In the images shown in FIG. 12, concave portions of the irregularities are illustrated by lines surrounding them with dots added therein, and adjacent convex portions are collectively indicated as one convex portion for the sake of convenience of illustration. As shown in FIG. 12, in the image of the evaluation test 1-1, it was clear that the irregularities were formed. However, in the evaluation tests 1-2 and 1-3, the number of irregularities was small.

In the evaluation tests 1-2 and 1-3 in which the processing gas supply time in single step S1 is relatively long, the roughness of the surface of the Si film 11 is suppressed. In the evaluation test 1-1, the reaction between the processing gas and the surface layer of the Si film 11 is insufficient, and the sublimation in step S2 is performed in a state where the thickness uniformity of the AFS layer 13 is low. On the other hand, in the evaluation tests 1-2 and 1-3, the reaction between the surface layer of the Si film 11 and the processing gas is sufficient, so that the AFS layer 13 is formed to have a uniform thickness as described in the above embodiment.

In the evaluation test 1-2 in which the supply time is 45 seconds, it is considered that the roughness of the surface is sufficiently suppressed, and the roughness can be suppressed even if the supply time is slightly shorter than 45 seconds. However, in the evaluation test 1-1 in which the supply time of the processing gas is 30 seconds, some roughness is observed. From the above, it is considered that the processing gas supply time is preferably 40 seconds or more. However, if the processing gas supply time is excessively long, the processing gas cannot act on the Si film 11 while being blocked by the formed AFS layer 13, so that the processing gas is wasted. Since the roughness of the Si film 11 is appropriately suppressed when the processing gas supply time is 60 seconds, it is desirable that the minimum processing gas supply time is longer than the above supply time, e.g., 120 seconds.

Evaluation Test 2

Next, an evaluation test 2 will be described. Similarly to the evaluation test 1, in the evaluation test 2, the Si film 11 was etched by repeatedly executing steps S1 and S2 in a plurality of wafers W. Then, the image of the surface of the Si film 11 was acquired, and the etching selectivity was calculated. In the evaluation test 2, the processing was performed in a state where the processing gas supply time in single step S1 was set to 30 seconds for each wafer W and the number of repetitions of steps S1 and S2 was set to six for each wafer W. Therefore, the processing gas supply period in single step S1 and the number of repetitions of steps S1 and S2 are the same as those in the evaluation test 1-1. However, the NH$_3$ gas flow rate is different from that in the evaluation test 1-1. The NH$_3$ gas flow rate has a following relationship: the evaluation test 2-1<the evaluation test 1-1<the evaluation test 2-2. In the evaluation test 2, the processing conditions other than the NH$_3$ gas flow rate are the same as those in the evaluation test 1.

Figure 13:
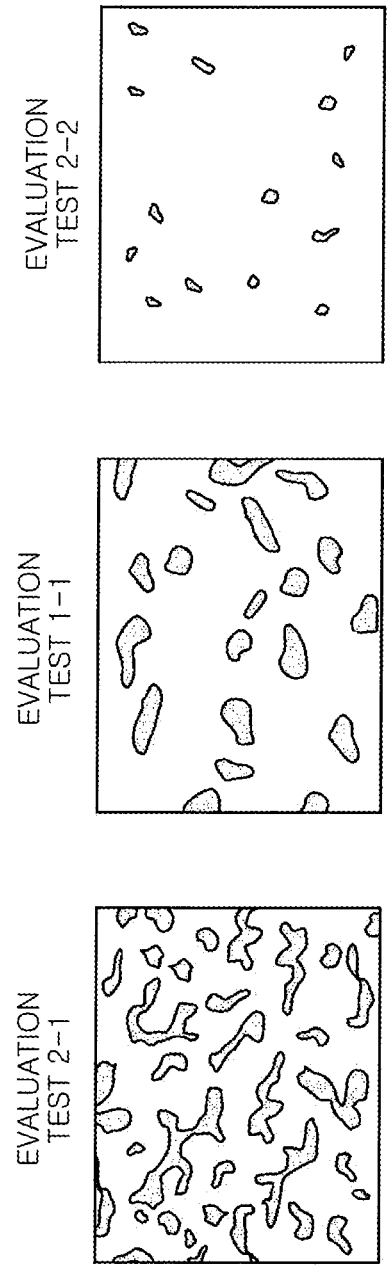

The etching selectivity in the evaluation tests 2-1 and 2-2 was 30 or more, so that the Si film 11 was selectively etched with respect to the Si Ge film 12. FIG. 13 schematically shows the images acquired in the evaluation tests 2-1 to 2-2, as in the case of the evaluation test 1. For better understanding of the test results, the image acquired in the evaluation test 1-1 shown in FIG. 12 is also schematically illustrated in FIG. 13. As shown in FIG. 13, the roughness is larger in the evaluation test 2-1 than in the evaluation test 1-1, and the roughness is suppressed in the evaluation test 2-2. Therefore, the roughness is further suppressed as the NH$_3$ gas flow rate increases. This is because F$_2$ gas is supplied at a relatively large flow rate, the amount of the surface layer of the Si film 11 that is deformed to the AFS layer 13 increases as the NH$_3$ gas flow rate increases, and the thickness uniformity of the AFS layer 13 increases as described above.

In the evaluation test 1-1, the ratio of the NH$_3$ gas flow rate to the F$_2$ gas flow rate (NH$_3$ gas flow rate/F$_2$ gas flow rate) is 0.026. As describe above, some irregularities are observed in the evaluation test 1-1, so that the ratio is preferably higher than 0.026. In the evaluation test 2-2, the NH$_3$ gas flow rate is set to be within the range described in the above embodiment, and the NH$_3$ gas flow rate/the F$_2$ gas flow rate is 0.036. Therefore, the corresponding ratio is more preferably 0.036 or more.

Evaluation Test 3

Next, an evaluation test 3 will be described. The cycle of steps T1 to T5 described in the second embodiment was repeated 10 times to process a plurality of wafers W having the structure 71 described in FIGS. 6 and 7. The flow rate of the HF gas supplied into the processing chamber 41 in step T3 was changed for each wafer W to be processed. Then, the image of the processed wafer W was obtained by SEM, and the surface state of the Si film 74 in the structure 71 was observed. The tests in which the flow rate of HF gas was set to 100 sccm, 200 sccm, and 450 sccm are set to evaluation tests 3-1, 3-2, and 3-3, respectively.

The pressure in the processing chamber 41 was set to be within the range described in the above embodiment, and the HF gas supply time was set to 30 seconds. The flow rates of Ar gas and N$_2$ gas supplied into the processing chamber 41 together with HF gas were set to 275 sccm. In an evaluation test 3-4, the processing was performed under the same conditions as those in the evaluation tests 3-1 to 3-3 except that steps T3 and T4 (purging using N$_2$ gas after the HF gas supply) are not executed, and the images were obtained by SEM. Therefore, in the processing of the evaluation test 3-4, steps S1 and S2 described in the first embodiment are repeated.

Figure 14:
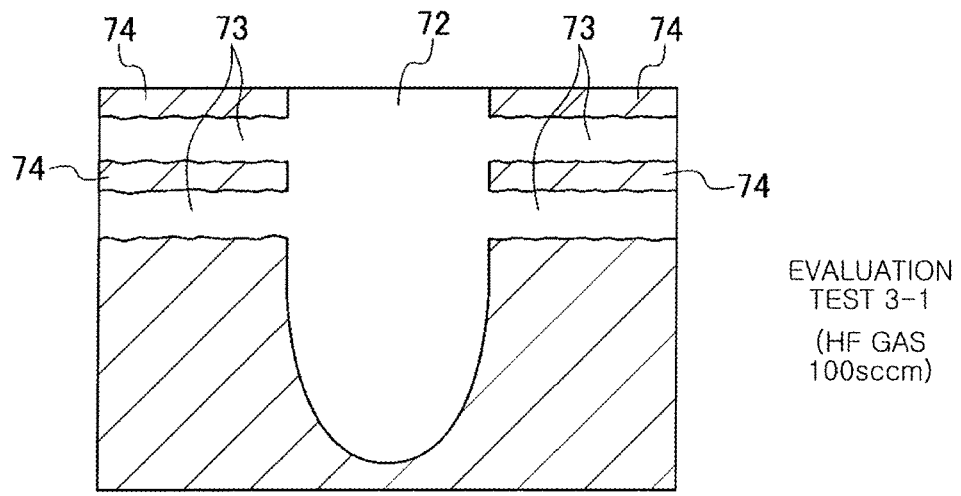
FIG. 14 schematically illustrates the recess of the wafer and shows evaluation test results.
Figure 14:
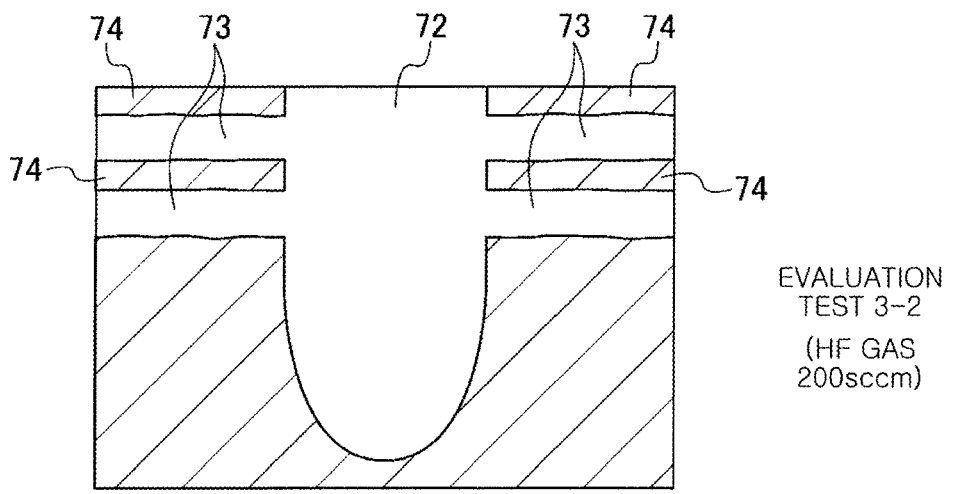
Figure 14:
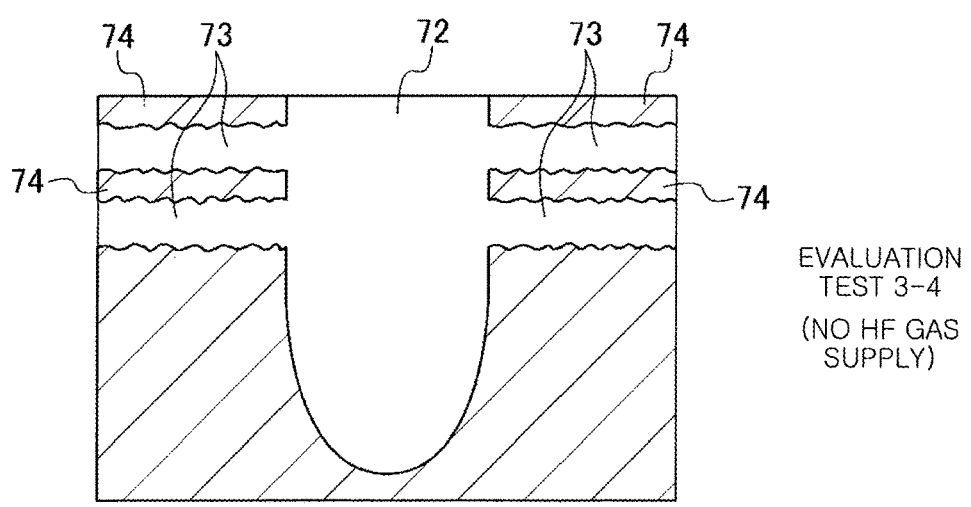

The images obtained in the evaluation tests 3-1, 3-2, and 3-4 are schematically illustrated in the upper part, the intermediate part, and the lower part of FIG. 14, respectively. The roughness of the surface of the Si film 74 is suppressed in the evaluation tests 3-1 to 3-3 that in the evaluation test 3-4. Therefore, as described in the second embodiment, it is preferable to supply HF gas. The roughness is suppressed in the evaluation tests 3-2 and 3-3 than in the evaluation test 3-1, and the roughness in the evaluation tests 3-2 and 3-3 is practically desirable. Since the roughness in the evaluation tests 3-2 and 3-3 is the same, FIG. 14 schematically shows only the evaluation test 3-2 between the evaluation tests 3-2 and 3-3.

From the above results, it is clear that the flow rate of the HF gas supplied to the wafer W in step T3 is preferably 100 sccm or more, and more preferably 200 sccm or more. As described above, Ar gas and N$_2$ gas that are inert gases are supplied at the flow rate of 250 sccm during the HF gas supply. Therefore, the ratio of the HF gas flow rate to the flow rate of all gases supplied into the processing chamber 41 is expressed by the following Eq. (2). X in Eq. (2) indicates the HF gas flow rate.

$$X\text{sccm}/(X+250+250)\text{sccm} \qquad \text{Eq. (2)}$$

When X is 100 sccm, the ratio of 0.1667 is obtained from Eq. (2). When X is 200 sccm, the ratio of 0.2857 is obtained from Eq. (2). Therefore, from the evaluation test 3, it is clear that the ratio of the HF flow rate to the flow rate of all gases supplied into the processing chamber 41 is preferably 0.1667 or more, and more preferably 0.2857 or more. It is considered that the roughness state was similar in the evaluation tests 3-2 and 3-3 because the roughness is improved due to the deformation of the Si film 74 by the action of fluorine in the AFS layer 13, but the amount of fluorine that can contribute to the deformation of the Si film 74 in the AFS layer 13 is limited even if the HF gas flow rate is increased.

Evaluation Test 4

Next, an evaluation test 4 will be described. In the evaluation test 4, the cycle of steps T1, T2, and T5 in the second embodiment was repeated nine times to process the wafer W having the structure 71. Then, the SEM image of the structure 71 was obtained, and the etching amount near the opening in the recess 73 and the etching amount near the inner portion (near the end opposite to the opening) were measured. It is more preferable that the etching amount difference is smaller. The flow rate of NH$_3$ gas supplied into the processing chamber 41 in step S1 was differently set for each wafer W. The NH$_3$ gas flow rate was set to any one of 5 sccm, 8 sccm, 10 sccm, 12 sccm, and 14 sccm.

In step S1, the flow rates of F$_2$ gas and Ar gas supplied to the processing chamber 41 were set to 500 sccm and 200 sccm, respectively. The N$_2$ gas flow rate was changed depending on the NH$_3$ gas flow rate, and was set such that the total flow rate of N$_2$ gas and NH$_3$ gas becomes 700 sccm. The F$_2$ gas supply time of and the NH$_3$ gas supply time in one cycle were set to 15 seconds. The temperature of the wafer W was set to be within the range described in the above embodiment.

Figure 15:
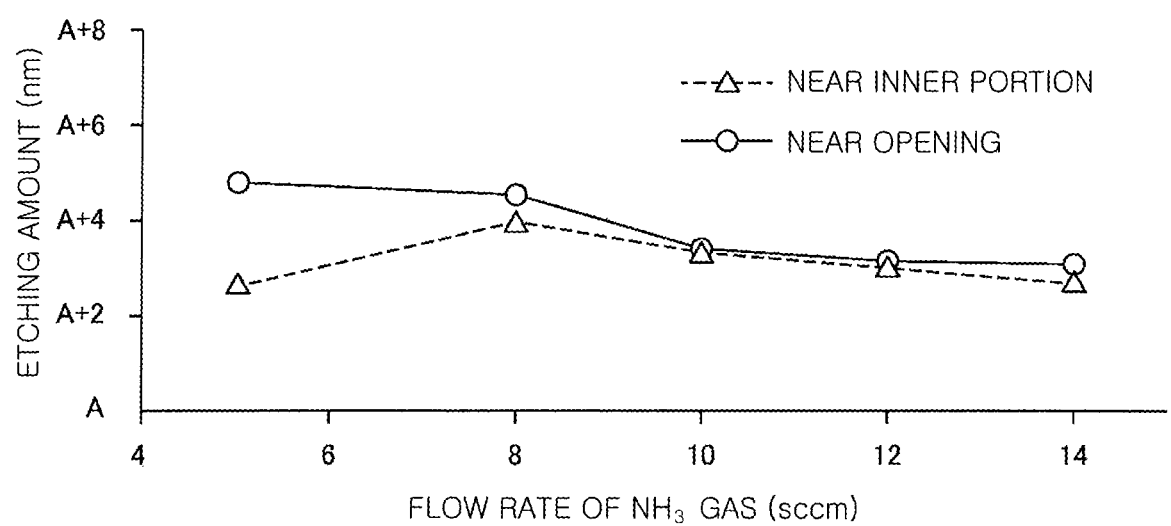
FIG. 15 is a graph showing evaluation test results.

FIG. 15 is a graph showing the results of the evaluation test 4. In FIG. 15, the vertical axis and the horizontal axis represent an etching amount (unit: nm) and an NH$_3$ gas flow rate (unit: sccm), respectively. The scale on the vertical axis increases in increments of 2 nm from A that is a real number. As can be seen from the graph, when the NH$_3$ gas flow rate is 5 sccm, the etching amount is smaller near the inner portion than near the opening, and the etching amount difference is relatively large. When the NH$_3$ gas flow rate is 8 sccm, the etching amount is smaller near the inner portion than near the opening, and the etching amount difference is smaller compared to when the NH$_3$ gas flow rate is 5 sccm. However, it is preferable that the etching amount difference is even smaller.

When the NH$_3$ gas flow rate was 10 sccm or more, the etching amount difference was sufficiently small. It is considered that this is because when the NH$_3$ gas flow rate was 10 sccm or more, the NH$_3$ gas was sufficiently supplied from the opening in the recess 73 to the inner portion, so that the AFS layer 13 was sufficiently formed on the surfaces of the upper wall and the lower wall formed as the Si film 74 forming the recess 73.

As described above, in the evaluation test 4, it is preferable that the $NH_3$ gas flow rate is preferably greater than 8 sccm and more preferably greater than 10 sccm in order to uniform etch each portion of the recess 73 by simultaneously supplying $F_2$ gas and $NH_3$ gas into the processing chamber 41. As described above, $F_2$ gas was supplied at a flow rate of 500 sccm. Therefore, in the evaluation test 4, the ratio of the $NH_3$ gas flow rate to the $F_2$ gas flow rate is preferably greater than 0.016 (=8 sccm/500 sccm), and is more preferably greater than 0.02 (=10 sccm/500 sccm).

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
   a first step of supplying a processing gas containing a halogen-containing gas and a basic gas to a substrate, on which a silicon film is formed, at a first temperature, thereby deforming a surface of the silicon film to generate a reaction product, wherein the processing gas is supplied to the substrate for a predetermined time or longer in a state where the reaction product remains on the silicon film so that a thickness of the reaction product becomes uniform; and
   a second step of removing the reaction product at a second temperature after the first step.

2. The substrate processing method of claim 1, further comprising a step of sequentially repeating the first step and the second step.

3. The substrate processing method of claim 2, wherein the silicon film remains on the substrate after the repeating step.

4. The substrate processing method of claim 1, wherein the second temperature is higher than the first temperature.

5. The substrate processing method of claim 1, wherein a silicon-containing film, which is different from the silicon film, is formed on the surface of the substrate, and
   in the first step and the second step, the silicon film is selectively deformed with respect to the silicon-containing film and removed.

6. The substrate processing method of claim 5, wherein the silicon-containing film is an SiGe film.

7. The substrate processing method of claim 1, wherein the first temperature is within a range of −20° C. to 60° C.

8. The substrate processing method of claim 1, wherein in the first step, the halogen-containing gas and the basic gas are simultaneously supplied to the substrate.

9. The substrate processing method of claim 8, wherein in the first step, the halogen-containing gas and the basic gas are simultaneously supplied to the substrate for 40 seconds or longer.

10. The substrate processing method of claim 1, wherein the halogen-containing gas is a fluorine gas, and the basic gas is an ammonia gas.

11. The substrate processing method of claim 10, wherein in the first step, the fluorine gas and the ammonia gas are simultaneously supplied into the processing chamber storing the substrate, and a ratio of a flow rate of the ammonia gas supplied into the processing chamber to a flow rate of the fluorine gas supplied into the processing chamber is greater than 0.16.

12. The substrate processing method of claim 1, wherein the first step includes:
   a first supply step in which the supply of the halogen-containing gas to the substrate and the supply of the basic gas to the substrate are simultaneously performed; and
   a second supply step in which only one of the halogen-containing gas and the basic gas is supplied to the substrate after the first supply step.

13. The substrate processing method of claim 12, wherein the halogen-containing gas includes a first fluorine-containing gas supplied to the substrate in the first supply step and a second fluorine-containing gas supplied to the substrate in the second supply step, and
   the first fluorine-containing gas and the second fluorine-containing gas are different.

14. The substrate processing method of claim 13, wherein the first fluorine-containing gas is a fluorine gas, and
   the second fluorine-containing gas is a hydrogen fluoride gas.

15. A substrate processing method comprising:
   supplying a processing gas containing a halogen-containing gas and a basic gas to a substrate, on which a silicon film is formed, thereby deforming a surface of the silicon film to generate a reaction product;
   supplying the processing gas to the substrate for a predetermined time or longer in a state where the reaction product remains on the silicon film so that a thickness of the reaction product becomes uniform; and
   removing the reaction product.

* * * * *